(12) United States Patent
Nakamura et al.

(10) Patent No.: US 7,797,804 B2
(45) Date of Patent: Sep. 21, 2010

(54) MULTILAYERED PIEZOELECTRIC ELEMENT AND METHOD OF MANUFACTURING THE SAME

(75) Inventors: Takashi Nakamura, Kasei-machi (JP); Atsushi Osawa, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/351,362

(22) Filed: Jan. 9, 2009

(65) Prior Publication Data

US 2009/0119896 A1 May 14, 2009

Related U.S. Application Data

(62) Division of application No. 11/657,057, filed on Jan. 24, 2007, now abandoned.

(30) Foreign Application Priority Data

Feb. 7, 2006 (JP) ............................. 2006-029825

(51) Int. Cl.
*H04R 17/00* (2006.01)
(52) U.S. Cl. .................... 29/25.35; 29/846; 29/830; 29/841; 310/328; 310/365; 310/366
(58) Field of Classification Search ................ 29/25.35; 310/311
See application file for complete search history.

(56) References Cited

U.S. PATENT DOCUMENTS

| 5,009,982 A | * | 4/1991 | Kamayachi et al. | ...... 430/280.1 |
| 5,568,679 A | | 10/1996 | Ohya et al. | |
| 6,368,661 B2 | * | 4/2002 | Nakano | ............ 427/142 |
| 2004/0178701 A1 | * | 9/2004 | Sato et al. | ............ 310/328 |
| 2005/0012788 A1 | * | 1/2005 | Yamaguchi et al. | ............ 347/68 |

FOREIGN PATENT DOCUMENTS

JP           61-32835 B2    7/1986

\* cited by examiner

*Primary Examiner*—Derris H Banks
*Assistant Examiner*—Azm Parvez
(74) *Attorney, Agent, or Firm*—Sughrue Mion, PLLC

(57) ABSTRACT

A multilayered piezoelectric element in which braking to displacement of piezoelectric material layers is suppressed and insulating films suitable for thinning of the piezoelectric material layers are formed. A method of manufacturing the element includes the steps of: (a) forming a multilayered structure including piezoelectric material layers, at least one first electrode layer, and at least one second electrode layer; (b) discharging a liquid synthetic resin from a nozzle provided in a dispenser to apply it to an end portion of the first electrode layer in a first region within side surfaces of the multilayered structure and curing the liquid synthetic resin to form a first insulating film; and (c) discharging the liquid synthetic resin from the nozzle to apply it to an end portion of the second electrode layer in a second region and curing the liquid synthetic resin to form a second insulating film.

7 Claims, 6 Drawing Sheets

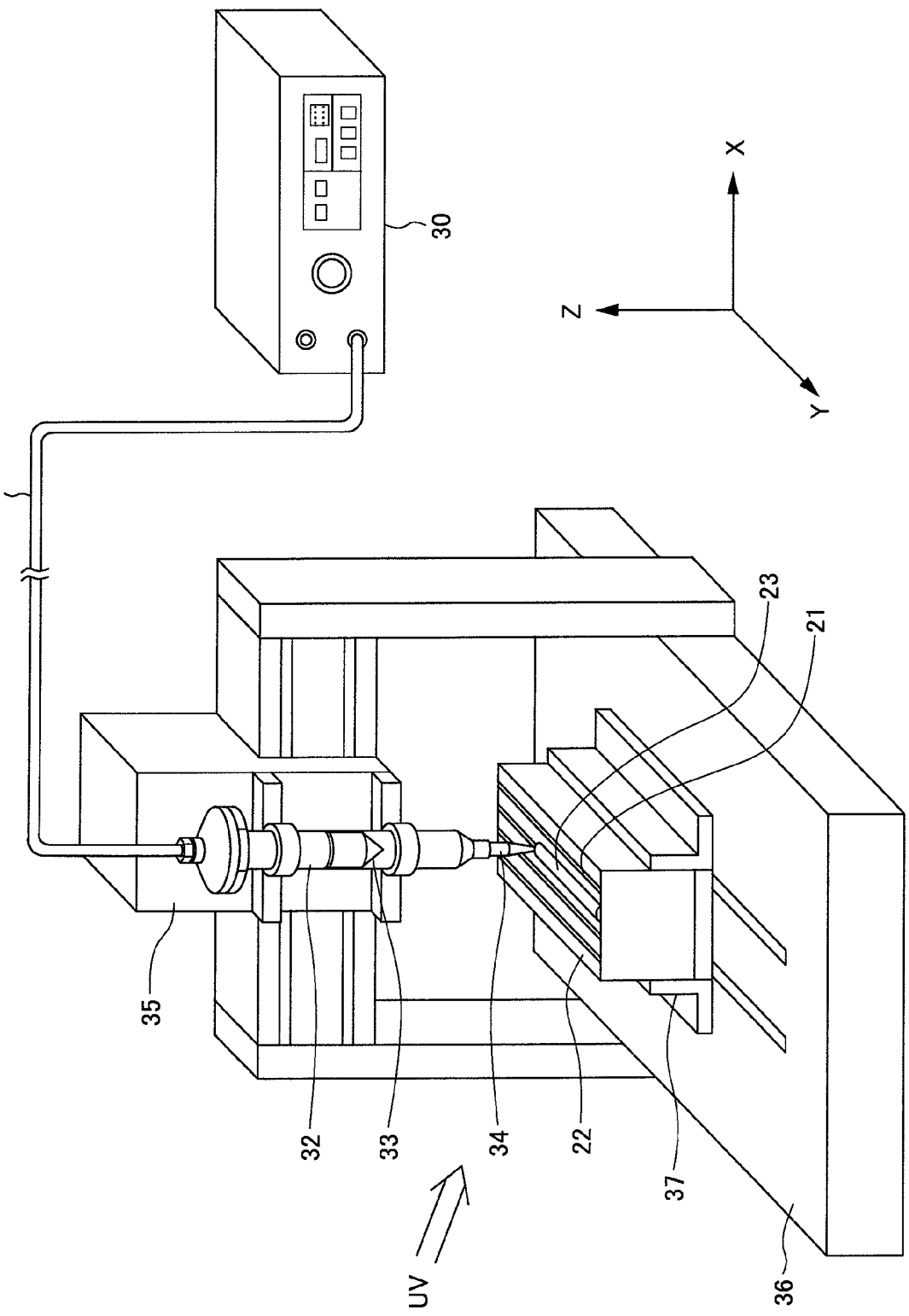

FIG.6

| SAMPLE No. | MATERIAL OF INSULATING FILM | | VISCOSITY (mPa·s) | YOUNG'S MODULUS AFTER CURING (×10$^{10}$ dyn·cm$^{-2}$) | INSULATING FILM WIDTH(μm) /THICKNESS (μm) | INSULATING FILM W/t VALUE | PIEZOELECTRIC ELEMENT (THICKNESS OF PIEZOELECTRIC MATERIAL LAYER) × (NUMBER OF LAYERS) | PIEZOELECTRIC ELEMENT k$_{33}$ | PIEZOELECTRIC ELEMENT WITHSTAND VOLTAGE (kV) |
|---|---|---|---|---|---|---|---|---|---|
| 1 | | NONE | — | — | — | — | 300 μm × 1 | 0.71 | — |
| 2 | LIGHT CURABLE RESIN | URETHANE ACRYLATE RESIN | 500 | 1.33 | 200/7 | 28.5 | 100 μm × 3 | 0.68 | 0.70 |
| 3 | LIGHT CURABLE RESIN | URETHANE ACRYLATE RESIN | 200 | 1.33 | 250/5 | 50 | 100 μm × 3 | — | 0.40 |
| 4 | LIGHT CURABLE RESIN | URETHANE ACRYLATE RESIN | 2,000 | 1.30 | 140/10 | 14 | 100 μm × 3 | 0.685 | 0.80 |
| 5 | LIGHT CURABLE RESIN | URETHANE ACRYLATE RESIN | 5,000 | 1.30 | 110/20 | 5.5 | 100 μm × 3 | 0.69 | 1.04 |
| 6 | LIGHT CURABLE RESIN | EPOXY RESIN | 5,000 | 1.42 | 110/20 | 5.5 | 100 μm × 3 | 0.67 | 1.83 |
| 7 | LIGHT CURABLE RESIN | EPOXY RESIN | 10,000 | 1.70 | 150/30 | 5.0 | 100 μm × 3 | 0.67 | 2.20 |
| 8 | LIGHT CURABLE RESIN | EPOXY RESIN | 20,000 | 1.80 | 100/25 | 4.0 | 100 μm × 3 | 0.68 | 2.07 |
| 9 | LIGHT CURABLE RESIN | EPOXY RESIN | 30,000 | 1.83 | 80/25 | 3.2 | 100 μm × 3 | 0.685 | 2.05 |
| 10 | LIGHT CURABLE RESIN | EPOXY RESIN | 50,000 | 1.83 | 70/25 | 2.8 | 100 μm × 3 | 0.695 | 2.10 |
| 11 | LIGHT CURABLE RESIN | EPOXY RESIN | 100,000 | 1.85 | 65/30 | 2.2 | 100 μm × 3 | 0.685 | 2.35 |
| 12 | LIGHT CURABLE RESIN | EPOXY RESIN | 500,000 | 1.85 | 65/30 | 2.2 | 100 μm × 3 | — | — |
| 13 | | TWO-COMPONENT EPOXY RESIN | 15,000 | 1.50 | 180/15 | 12 | 100 μm × 3 | 0.680 | 1.00 |
| 14 | | GLASS | — | 52.0 | 150/35 | 4.3 | 100 μm × 3 | 0.63 | 2.0 |

FIG.7
|  | ELECTROMECHANICAL COUPLING FACTOR $k_{33}$ | PIEZOELECTRIC STRAIN CONSTANT $d_{33}$ |
|---|---|---|
| WORKING EXAMPLE (LIGHT CURABLE RESIN INSULATING FILM) | 0.67 | 645pm/V |
| COMPARATIVE EXAMPLE (GLASS INSULATING FILM) | 0.63 | 600pm/V |
FIG.8
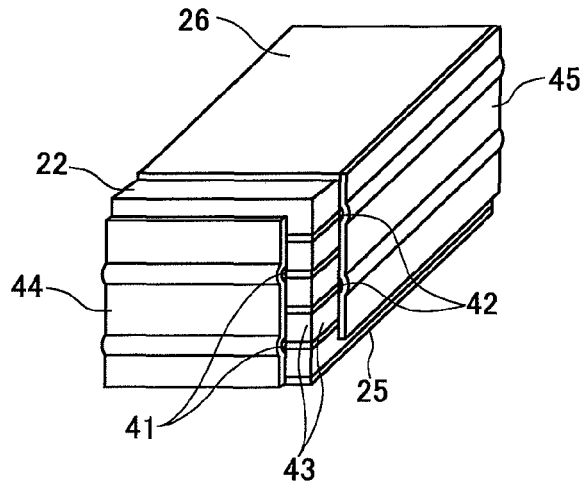
FIG.9
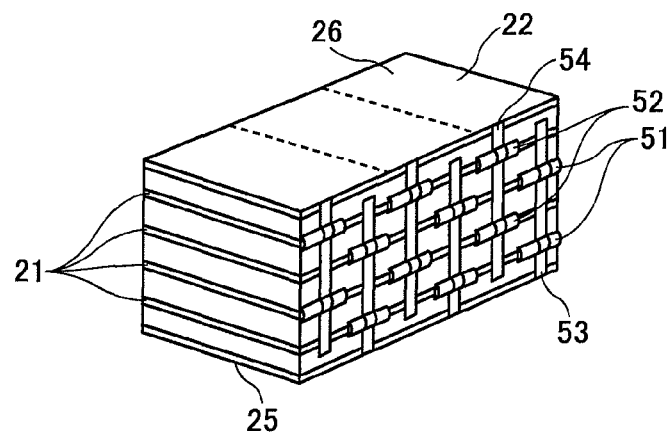

MULTILAYERED PIEZOELECTRIC ELEMENT AND METHOD OF MANUFACTURING THE SAME

This is a divisional of application Ser. No. 11/657,057 filed Jan. 24, 2007 now abandoned. The entire disclosure(s) of the prior application(s), application Ser. No. 11/657,057 is considered part of the disclosure of the accompanying divisional application and is hereby incorporated by reference.

BACKGROUND OF THE INVENTION

1. Field of the Invention

The present invention relates to a piezoelectric element having a multilayered structure (multilayered piezoelectric element) to be used as a piezoelectric actuator, ultrasonic transducer and so on, and a method of manufacturing the same.

2. Description of a Related Art

A piezoelectric material represented by a material having a lead-based perovskite structure such as PZT (Pb(lead) zirconate titanate) provides a piezoelectric effect of expanding and contracting when applied with an electric field. A piezoelectric element having the property is utilized in various uses such as piezoelectric pumps, piezoelectric actuators and ultrasonic transducers. The structure of a piezoelectric element is basically a single-layer structure in which electrodes are formed on both ends of one piezoelectric material. According to microfabrication and integration of piezoelectric elements with recent developments of MEMS (micro electro mechanical systems) related devices, multilayered piezoelectric elements each having plural piezoelectric materials and plural electrodes alternately stacked have been used. In such a piezoelectric element, the interelectrode capacitance of the multilayered structure as a whole can be made larger by connecting electrodes for applying electric fields to the respective plural piezoelectric material layers in parallel. Accordingly, the rise in electrical impedance can be suppressed even when the size of the piezoelectric element is made smaller.

As a related technology, Japanese Examined Patent Application Publication JP-B-61-32835 (Japanese Patent Application Publication JP-A-59-115579) discloses an electrostrictive effect element having films or thin plates of an electrostrictive material and internal electrode plates alternately stacked, in which end surfaces of the internal electrode plates are exposed on side end surfaces of the element and insulating layers are formed only on the exposed portions of the internal electrode plates and the electrostrictive material near the exposed portions on the side end surfaces (FIGS. 3 and 4).

In the electrostrictive effect element, the insulating film formed in a region including the end surface (side end surface) of the internal electrode is formed by depositing low-melting glass particles on the region by using electrophoresis, then heating the glass particles to a temperature higher than the glass softening point to melt them, and further, cooling and fixing them onto the region (page 3, FIG. 5).

In the case where the insulating film is formed according to the method, the following problems arise in the multilayered piezoelectric element. That is, since the glass material is relatively hard and has lower elasticity, when the piezoelectric material layer (the electrostrictive material film or thin plate in JP-B-61-32835) attempts to expand and contract when the multilayered piezoelectric element is driven, a brake is applied to the displacement of the region where the insulating film is fixed. Accordingly, it is hard to sufficiently bring out the performance of the piezoelectric material represented by electromechanical coupling factor $k_{33}$ or the like. Here, an electromechanical coupling factor is a constant representing efficiency of converting given electric energy into mechanical energy (vibration energy) when a voltage is applied to electrodes provided on both sides of a piezoelectric material. Further, the electromechanical coupling factor $k_{33}$ among the factors corresponds to an electromechanical coupling factor with respect to the same direction as a direction in which the voltage is applied, that is, an electromechanical coupling factor in the longitudinal vibration mode. The electromechanical coupling factor $k_{33}$ is expressed by the following equation.

$k_{33}^2$=(mechanical energy utilized for vibration of the piezoelectric material)/(electrical energy applied to the piezoelectric material)

Especially, high transmission and reception sensitivity is necessary when the piezoelectric element is utilized as an ultrasonic transducer that transmits and receives ultrasonic waves in an ultrasonic diagnostic apparatus, and accordingly, it is desired that the performance of the piezoelectric material is maximized.

Further, in the conventional multilayered piezoelectric element, the glass particles are once melted for forming insulating films of glass, and the thickness of the insulating film becomes thinner and the width thereof becomes wider at the melting. Thereby, the withstand voltage between the internal electrode and the side electrode becomes lower, and the reliability of the multilayered piezoelectric element also becomes lower. Especially, in polarization treatment (poling) for providing a piezoelectric property to a piezoelectric element, a voltage larger than the drive voltage is applied, and breakdown occurs in a region having a low withstand voltage. Further, recent years, the piezoelectric material has been made thinner and thinner for downsizing of the multilayered piezoelectric element, and it is desirable that the width of the insulating film is as narrow as possible.

SUMMARY OF THE INVENTION

The present invention has been achieved in view of the above-mentioned problems. A purpose of the present invention is to suppress braking to displacement of a piezoelectric material layer and form an insulating film suitable for thinning of a piezoelectric material layer in a multilayered piezoelectric element.

In order to achieve the above-mentioned purpose, a method of manufacturing a multilayered piezoelectric element according to one aspect of the present invention includes the steps of: (a) forming a multilayered structure including plural piezoelectric material layers, at least one first electrode layer, and at least one second electrode layer, the at least one first electrode layer and the at least one second electrode layer alternately stacked with respective one of the piezoelectric material layers in between; (b) placing a liquid synthetic resin on an end portion of the at least one first electrode layer in a first region within side surfaces of the multilayered structure and curing the liquid synthetic resin to form at least one first insulating film; and (c) placing a liquid synthetic resin on an end portion of the at least one second electrode layer in a second region different from the first region within the side surfaces of the multilayered structure and curing the liquid synthetic resin to form at least one second insulating film.

Further, a multilayered piezoelectric element according to one aspect of the present invention includes: a multilayered structure including plural piezoelectric material layers, at least one first electrode layer, and at least one second electrode layer, the at least one first electrode layer and the at least one second electrode layer alternately stacked with respective one of the piezoelectric material layers in between; at least one first insulating film formed of a synthetic resin on an end portion of the at least one first electrode layer in a first region within side surfaces of the multilayered structure; and at least one second insulating film formed of a synthetic resin on an end portion of the at least one second electrode layer in a second region different from the first region within the side surfaces of the multilayered structure; wherein a thickness of each of the first and second insulating films is larger than $E_c \cdot H_N/E$ and a ratio of width/thickness thereof is less than $2E/E_c$, where $H_N$ is a thickness of each of the plural piezoelectric material layers, $E_c$ is a coercive electric field thereof, and E is an electrical withstand voltage of the first and second insulating films.

According to the present invention, since the insulating films on the end portions of internal electrode layers are formed of resin materials with relatively high elasticity, the insulating films can be prevented from braking the displacement of the piezoelectric material layers when the multilayered piezoelectric element is driven. Further, since the insulating films with a small width/thickness ratio (i.e., high aspect ratio) can be formed by applying a liquid synthetic resin by using the dispenser, thinning of the piezoelectric material layers can be accommodated. Therefore, the performance and reliability of the multilayered piezoelectric element can be improved.

BRIEF DESCRIPTION OF THE DRAWINGS

FIG. 4 is a schematic diagram showing a configuration of a dispenser to be used in the method of manufacturing the multilayered piezoelectric element according to the one embodiment of the present invention;

FIG. 6 shows properties of insulating film materials and properties of multilayered piezoelectric elements on which insulating films are formed by employing those materials;

FIG. 7 shows properties of the multilayered piezoelectric elements in the working example and the comparative example;

FIG. 8 shows a variation of forming regions of insulating films and side electrodes; and FIG. 9 shows a variation of forming regions of insulating films and side electrodes.

DESCRIPTION OF THE PREFERRED EMBODIMENTS

Figure 1:
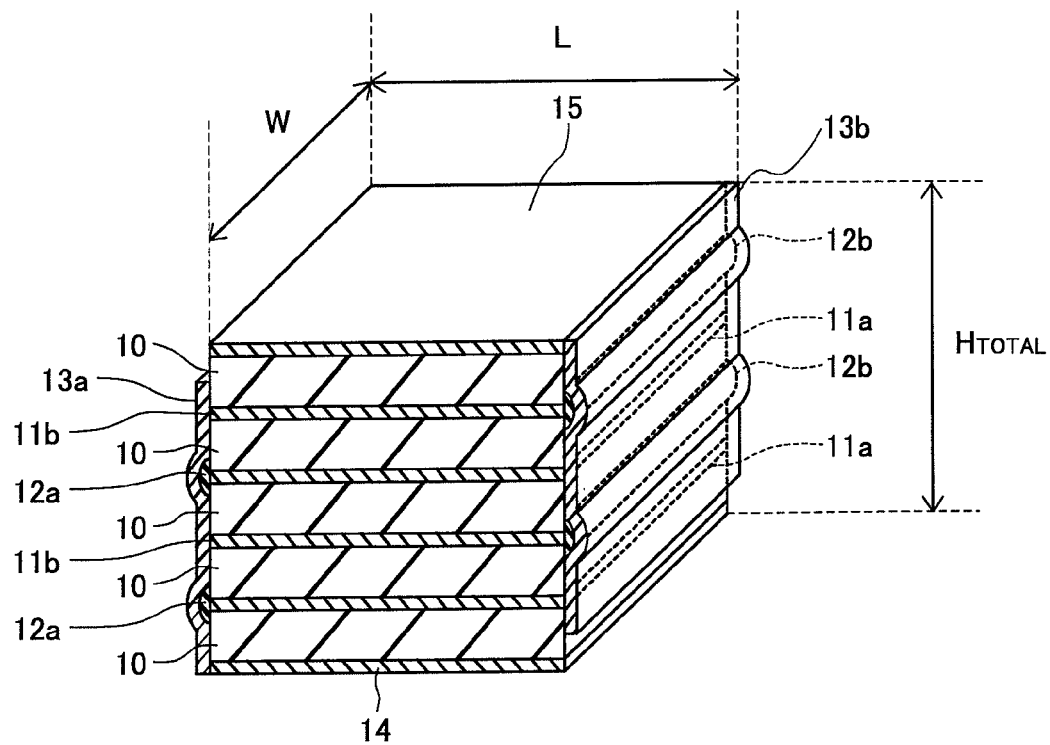
FIG. 1 is a partially sectional perspective view showing a structure of a multilayered piezoelectric element according to one embodiment of the present invention.

Hereinafter, preferred embodiments of the present invention will be explained in detail by referring to the drawings. The same reference numerals are assigned to the same component elements and the description thereof will be omitted.

As shown in FIG. 1, a multilayered piezoelectric element according to the embodiment is a columnar structure having a bottom surface with each side (length L, width W) of about 200 μm to 1.0 mm and a height $H_{TOTAL}$ of about 300 μm to 1.0 mm, for example. The multilayered piezoelectric element includes a multilayered structure having plural piezoelectric material layers 10 and plural internal electrode layers 11a and 11b, and insulating layers 12a and 12b formed on one end portions of the internal electrode layers 11a and 11b, respectively. Further, the multilayered piezoelectric element according to the embodiment may include side electrodes 13a and 13b respectively formed on two side surfaces of the multilayered structure. Furthermore, the multilayered piezoelectric element according to the embodiment may include a lower electrode layer 14 and an upper electrode layer 15.

The piezoelectric material layer 10 has a thickness of about 100 μm, for example, and is formed by employing a piezoelectric material that may have a lead-based perovskite structure such as PZT (Pb(lead) zirconate titanate). Although the five piezoelectric material layers 10 are shown in FIG. 1, the number of the piezoelectric material layers is at least two, and six or more layers may be formed.

The plural internal electrode layers 11a and 11b have a thickness of about 1 μm to 3 μm, for example, and they are alternately stacked with respective one of the piezoelectric material layers 10 in between. The internal electrode layers 11a and 11b may be formed of one kind of material or may have multilayer structures formed of different plural materials. As an example of the former case, there is a metal material such as platinum (Pt) and silver/palladium (Ag/Pd). As an example of the latter case, there is a two-layer electrode including an adhesion layer formed of titanium oxide ($TiO_2$) having a thickness of about 50 nm and a conducting layer formed of platinum (Pt) having a thickness of about 3 μm.

On one side surface of the multilayered structure (on the left side in FIG. 1), the insulating films 12a are formed on the end portions of the internal electrode layers 11a. On the other side surface of the multilayered structure (on the right side in FIG. 1), the insulating films 12b are formed on the end portions of the internal electrode layers 11b. These insulating films 12a and 12b are formed of a synthetic resin such as an epoxy synthetic resin, an urethane acrylate synthetic resin, a silicone synthetic resin, or an oxetane synthetic resin. In the resins, Young's modulus is $1.3 \times 10^9$ Pa to $2.0 \times 10^9$ Pa ($1.3 \times 10^{10}$ dyn·cm$^{-2}$ to $2.0 \times 10^{10}$ dyn·cm$^{-2}$), which is very small compared to glass or the like. Accordingly, when the respective piezoelectric material layers 10 attempt to expand and contract by the driving of the multilayered piezoelectric element, the insulating films 12a and 12b are able to follow the expansion and contraction (displacement), and there is little braking to the displacement due to the insulating films.

Figure 2:
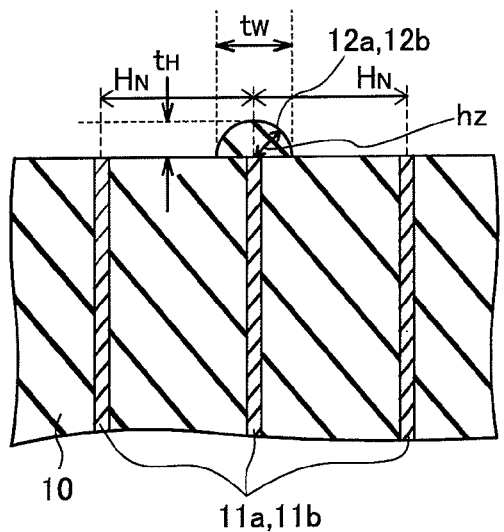
FIG. 2 is an enlarged sectional view showing an insulating film shown in FIG. 1.

FIG. 2 is an enlarged view of the insulating films 12a and 12b shown in FIG. 1. In FIG. 2, the side electrodes 13a and 13b are omitted. As shown in FIG. 2, each of the insulating films 12a and 12b has a half-columnar shape, for example.

It is desirable that the widths ($t_W$) of the insulating films 12a and 12b are made as narrow as possible on a condition that they are able to cover the end portions of the internal electrode layers 11a and 11b. This is because the insulating films should not cover an end portion of the adjacent internal electrode layer. This condition may be expressed by the following expression (1) by using thickness $H_N$ of one piezoelectric material layer.

$$t_W = 2SH_N, \quad S<1 \tag{1}$$

In the expression (1), S is a factor of safety, and the upper limit thereof is desirably about 0.7 for practical purposes. Further, given that the number of stacked piezoelectric material layers is N, the thickness of the piezoelectric material layer 10 is expressed by $H_N = H_{TOTAL}/N$, and the thickness is, for example, about 50 μm to 100 μm. The width $t_W$ of the insulating film is designed to be in a range from about three times the thickness of the internal electrode layer (about 1 μm to 3 μm) to about 140 μm.

On the other hand, since the thickness $t_H$ of the insulating films 12a and 12b has an effect on the withstand voltage between the internal electrode layers 11a and 11b and the side electrodes 13a and 13b, in order to improve the durability of the multilayered piezoelectric element at the time of poling, the thickness is desirably made as thick as possible.

When a piezoelectric element is fabricated, the poling (polarization treatment) for providing a piezoelectric property to a piezoelectric material is performed. Accordingly, it is important to design the sizes of the insulating films 12a and 12b such that they bear the applied voltage at the time of poling treatment. Here, the thickness of the internal electrode layers 11a and 11b is much smaller than the thickness of the piezoelectric material layers 10, and the thickness of the internal electrode layers 11a and 11b will not be taken into consideration in the description as below.

As shown in FIG. 2, given that the shortest distance between the end portion of the internal electrode layer 11a or 11b and the surface of the insulating layer 12a or 12b (and the boundaries with the side electrodes 13a and 13b) is $h_Z$, the shortest distance $h_Z$ should have a thickness that can bear the poling voltage. Accordingly, given that the electrical withstand voltage of the insulating layers 12a and 12b is E (V/m) and the poling voltage is $V_P$, it is necessary that $h_Z > V_P/E$ is satisfied. Further, given that the coercive electric field of the piezoelectric material layer is $E_c$ and the thickness thereof is $H_N$, the poling voltage $V_P$ should be made larger than $E_c \cdot H_N$. Accordingly, when the poling voltage $V_P$ is expressed by $V_P = n \cdot E_c \cdot H_N$ (n>1), the following expression (2) holds.

$$h_Z > n \cdot E_c \cdot H_N / E, \quad n > 1 \qquad (2)$$

Where n is a factor of margin and typically set to about n=3 to 5 for sufficient poling of the piezoelectric material layers.

Substituting the modified expression $H_N = t_W/2S$ of the expression (1) into the expression (2), the following expression (3) is derived.

$$h_Z > n \cdot E_c \cdot t_W / 2SE$$

$$t_W/h_Z < 2SE/nE_c, \quad n > 1, \quad S < 1 \qquad (3)$$

Here, as shown in FIG. 2, when the sections of the insulating layers 12a and 12b have semi-circular shapes or semi-elliptical shapes ($t_H \leq t_W/2$), the shortest distance $h_Z$ corresponds to the height $t_H$ of the insulating films.

From the expression (3), and considering n>1, S<1, the upper limit of a ratio of width/height ($t_W/t_H$) of the insulating films becomes smaller than $2E/E_c$. Further, considering the desirable range of the factor of safety S as S=0.4 to 0.7 and the desirable range of the factor of margin n as n=3 to 5, an appropriate range of $t_W/t_H$ is expressed by $t_W/t_H < 0.16E/E_c$ (for S=0.4, n=3), $t_W/t_H < 0.47E/E_c$ (for S=0.7, n=5), and so on.

Specific numerical values are substituted into the conditions expressed by the expressions (2) and (3). For example, in the case where the insulating layers 12a and 12b are formed of an epoxy resin (electrical withstand voltage $E=9 \times 10^7$ V/m), given that the factor of margin n is 3, the coercive electric field $E_c$ is $2 \times 10^6$ V/m, and the thickness of the piezoelectric material layer $H_N$ is 50 μm, the thickness of the insulating layers (or the shortest distance from the end portions of the internal electrode layers to the surfaces of the insulating films) may be at least $3.3 \times 10^{-6}$ m. Further, given that the factor of safety S is 0.7, the width of the insulating films may be determined such that the ratio of width/thickness of the insulating films is less than about 21.

As described later, in the embodiment, in order to satisfy the conditions (size and shape) of the insulating films, the insulating films are formed by employing a liquid synthetic resin having viscosity to some degree.

Referring to FIG. 1 again, the side electrode 13a is formed to be connected to the end portion of the internal electrode layers 11b and passed through the surface of the insulating film 12a so as to be insulated from the internal electrode layers 11a. Further, the side electrode 13b is formed to be connected to the end portion of the internal electrode layers 11a and passed through the surface of the insulating film 12b so as to be insulated from the internal electrode layers 11b.

The lower electrode layer 14 is connected to the side electrode 13a and the upper electrode layer 15 is connected to the side electrode 13b. These lower electrode layer 14 and upper electrode layer 15 may be formed of one kind of material or may have a multilayer structure including an adhesion layer and a conducting layer as is the case of the internal electrode layers 11a and 11b.

A voltage is supplied to the multilayered piezoelectric element via the lower electrode layer 14 and upper electrode layer 15. Thereby, the multilayered piezoelectric element expands and contract as a whole due to the piezoelectric effect in the respective piezoelectric material layers 10. As described above, the insulating layers 12a and 12b formed of a resin follow the displacement of the respective piezoelectric material layers 10. Accordingly, the respective piezoelectric material layers 10 are able to exert the original piezoelectric performance without being braked by the insulating films 12a and 12b.

Next, a method of manufacturing a multilayered piezoelectric element according to one embodiment of the present invention will be explained by referring to FIGS. 3A-5B. The first characteristic of the method of manufacturing a multilayered piezoelectric element according to the embodiment is that insulating films on the end potions of internal electrode layers are formed by using a dispenser. Further, the second characteristic of the method of manufacturing a multilayered piezoelectric element according to the embodiment is that a light curable (e.g., ultraviolet curable) synthetic resin is used as the material of the insulating films.

Figure 3A:
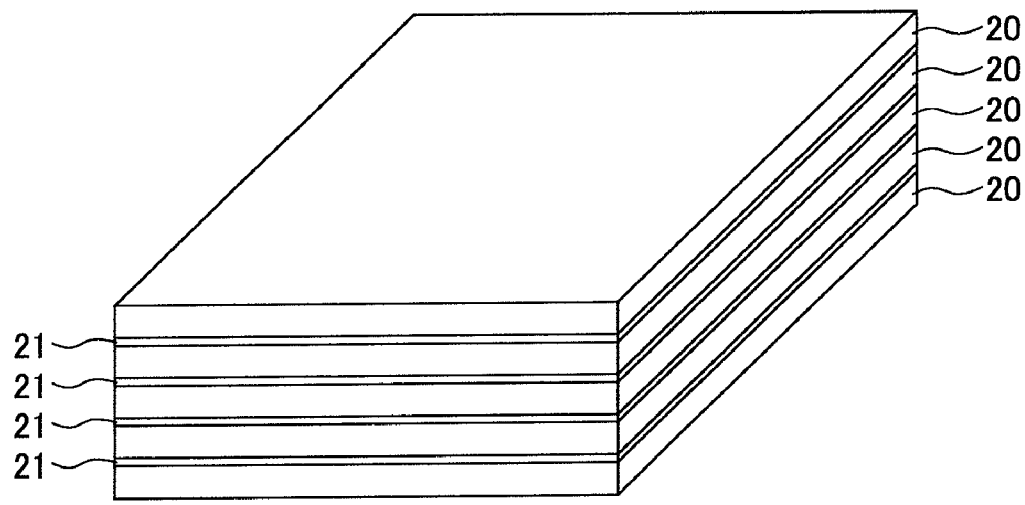
FIGS. 3A and 3B are diagrams for explanation of a method of manufacturing the multilayered piezoelectric element according to the one embodiment of the present invention.

First, as shown in FIG. 3A, a multilayered structure having plural piezoelectric material layers 20 and plural electrode layers 21 alternately stacked is fabricated. In the embodiment, the five piezoelectric material layers 20 each having a thickness of about 100 μm and four electrode layers 21 each having a thickness of about 2 μm are stacked. The material of the piezoelectric material layers 20 is PZT and the material of the electrode layers 21 is palladium silver.

The multilayered structure may be fabricated, for example, by using a green sheet method, by stacking PZT bulk materials on which palladium silver films have been formed, or by using the aerosol deposition (AD) method of spraying a powdery material toward an under layer at a high speed and depositing the material thereon. The AD method is a film forming method that has recently attracted attention as a method of forming a ceramics film.

Figure 3B:
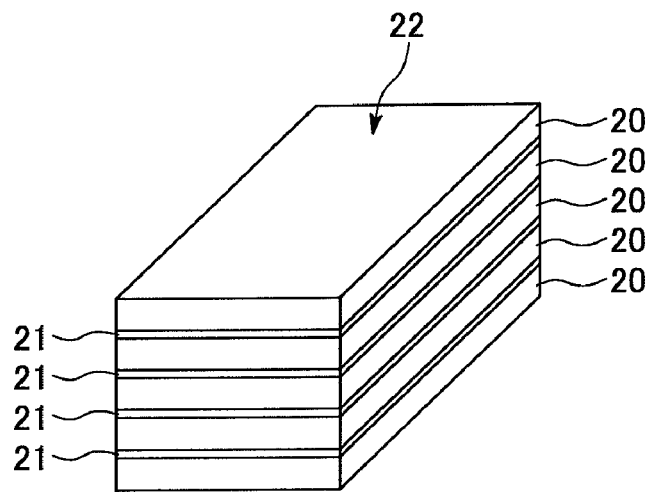

Then, by cutting thus fabricated multilayered structure in desired shapes and sizes, multilayered structures 22 shown in FIG. 3B are fabricated. In the embodiment, the multilayered structure is cut into pieces of about 25 mm in length and further cut into pieces of about 5 mm in width. It is desired that the multilayered structures 22 are subsequently cleaned by employing acetone or the like and confirmed that there is no dust attached to the insulating film forming surface.

Then, an insulating film is formed on the end portion of the electrode layer 21 exposed on the side surface of the multi-layered structure 22. FIG. 4 is a schematic diagram showing a dispenser (dispensing system) for forming an insulating film. Here, the dispenser refers to an apparatus or system for supplying a specific quantity of liquid and includes a controller for controlling the supply of liquid and peripheral devices. As shown in FIG. 4, in the embodiment, the system including a controller 30, an adapter tube 31, a syringe 32, a plunger 33, a nozzle 34, a nozzle stage 35, a sample stage 36, and a jig 37 is used.

The controller 30 controls the entire operation of the dispenser including the placement and displacement of the stage and quantity of liquid discharged from the nozzle (discharge speed). The controller 30 includes a compressor for feeding air to the syringe 32 via the adapter tube 31.

The syringe 32 is a container in which the liquid synthetic resin as the material of the insulating film is placed, and the nozzle 34 is attached to the tip of the syringe. The nozzle is a high-definition nozzle having an inner diameter of 100 μm or less, for example. Alternatively, a needle may be used in place of the nozzle 34. When air is fed to the syringe 32 via the adapter tube 31, the plunger 33 is pressed down according to the air pressure. Thereby, the liquid charged in the syringe 32 is discharged from the nozzle 34. The quantity of liquid discharged from the nozzle 34 is adjusted by the air pressure fed to the syringe 32.

The nozzle stage 35 includes a jig for fixing the syringe 32, and moves in the X-axis direction under the control of the controller 30. Further, the sample stage 36 includes a jig 37 for fixing a sample (the multilayered structure 22 in the embodiment), and the jig 37 moves in the Y-axis direction under the control of the controller 30. Furthermore, the jig 37 is provided with a mechanism for adjusting elevation angle θ.

In such a dispenser, the multilayered structure 22 is set on the sample stage 36 by using the jig 37 such that the insulating film forming surface is faced up and the electrode layers 21 are in parallel with the Y-axis. Further, the insulating film forming surface is adjusted to be horizontal by the adjustment mechanism of elevation angle θ. On the other hand, the light curable resin is placed in the syringe 32, air-release is performed in vacuum, and then, the syringe 32 is set on the nozzle stage 35. Furthermore, the nozzle 34 is positioned to the application start point of the light curable resin while the tip of the nozzle 34 is observed with a microscope.

Further, an operator sets programs for the controller 30 of the application start points and application end points of the light curable resin, the movement speed of the jig 37, the gap between the multilayered structure 22 (the insulating film forming surface) and the nozzle 34, the discharge pressure of the light curable resin, and so on.

The application of the light curable resin is started under the control of the controller 30. While the nozzle 34 discharges the light curable resin from the tip, the jig 37 moves in the Y-axis direction. Thereby, the liquid light curable resin is applied to or coated on the end portion of the electrode layer 21. Furthermore, light (e.g., ultraviolet (UV)) is applied to the light curable resin applied region. The liquid light curable resin cures by being irradiated with light, and consequently, an insulating film 23 is formed. Thus, after the application of the light curable resin for one line to the multilayered structure 22 is ended, the nozzle stage 35 moves in the X-axis direction to the next application start point (the end portion of every other electrode layer), and the insulating film 23 is formed in the same manner.

Figure 5A:
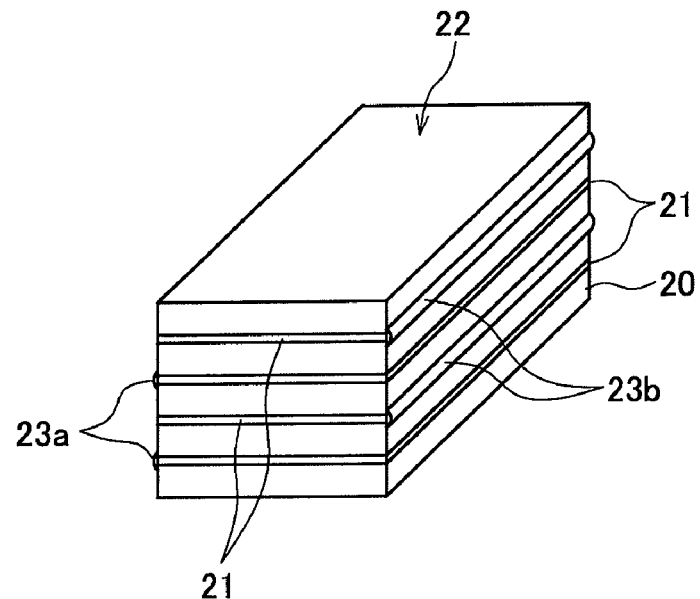
FIGS. 5A and 5B are diagrams for explanation of the method of manufacturing the multilayered piezoelectric element according to the one embodiment of the present invention.

Similarly, insulating films 23 are formed on the opposite surface of the multilayered structure 22. Thereby, as shown in FIG. 5A, the multilayered structure with insulating films 23a and 23b formed in a staggered manner on the two side surfaces is obtained.

Here, the shape and size of the liquid synthetic resin placed on the end portion of the electrode layer changes little after curing if the resin is quickly cured before the liquid synthetic resin flows. Therefore, when the liquid synthetic resin is placed, as has been explained by referring to FIG. 2, the placement width and placement height of the synthetic resin may be determined in consideration of the coercive voltage of the piezoelectric material layer and the electrical withstand voltage of the synthetic resin.

Figure 5B:
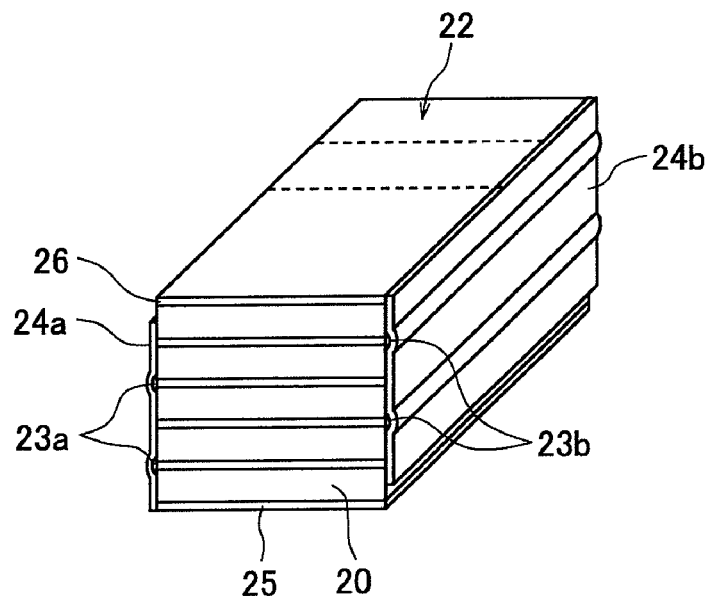

Then, as shown in FIG. 5B, side electrodes 24a and 24b are formed on two insulating film forming surfaces of the multilayered structure 22, respectively, and further, a lower electrode layer 25 and an upper electrode layer 26 are formed. These electrodes may be formed by employing a conducting metal such as silver (Ag) and platinum (Pt) according to a known method such as vapor deposition or sputtering. At that time, masks or the like are formed in advance such that the lower electrode layer 25 is insulated from the side electrode 24b and the upper electrode layer 26 is insulated from the side electrode 24a. Thereby, the multilayered piezoelectric element according to the embodiment is completed.

Furthermore, the piezoelectric material layers 20 are poled by applying a voltage $V_P$, that is larger than the coercive electric field $E_c \times$ thickness $H_N$ of each piezoelectric material layer 20 and satisfies the expression (2) (desirably, about three to five times $E_c \times H_N$), between the side electrode 24a or the lower electrode layer 25 and the side electrode 24b or the upper electrode layer 26. Thereby, a piezoelectric property is provided to the multilayered piezoelectric element. The poling treatment is typically performed in an insulating oil.

In the embodiment, the lower electrode layer 25 and the upper electrode layer 26 are finally formed, however, the lower electrode layer 25 and the upper electrode layer 26 may be formed together with internal electrode layers by providing electrode layers both in the lowermost layer and the uppermost layer when the multilayered structure shown in FIG. 3A is formed. Further, the multilayered piezoelectric element shown in FIG. 5B may be cut along a direction shown by broken lines, and thus, smaller multilayered piezoelectric elements may be fabricated.

Next, the synthetic resin suitable for use for the material of the insulating films in the embodiment will be explained.

In the embodiment, in order to form an insulating film having a low ratio of width/height ($t_W/t_H$ ratio) (i.e., a high aspect ratio) and sufficient elasticity, the liquid synthetic resin is cured. In the case where the liquid resin is used, a desired thickness can be obtained by applying the liquid synthetic resin to a desired region to have a desired width by using the dispenser while adjusting the viscosity of the liquid.

As the liquid synthetic resin, the resin having viscosity of about 500 mPa·s to 300,000 mPa·s is desirably used, and more preferably, the resin having viscosity of about 4,000 mPa·s to 50,000 mPa·s is desirably used. The lower limit of the viscosity of the synthetic resin is 500 mPa·s because the synthetic resin discharged from the nozzle immediately flows if the viscosity of the synthetic resin is too low and the width of the application region becomes wider and the thickness thereof becomes thinner (i.e., the $t_W/t_H$ ratio rises). For example, if a synthetic resin having low viscosity of about 200 mPa·s is discharged from the nozzle having an inner diameter of about 100 μm, the width of the insulating film immediately becomes 200 μm or more. Such a synthetic resin is not able to accommodate the multilayered structure having a piezoelectric material layer with a thickness of about 100 μm as in the embodiment. This is because the synthetic resin reaches the end portion of the internal electrode layer on which the insulating film should not be formed. Further, as the synthetic resin spreads, the thickness thereof becomes thinner, and thus, the withstand voltage when the poling treatment is performed on the piezoelectric material layer (e.g., about 600V in the case of the piezoelectric material layer with a thickness of about 100 μm) cannot be secured.

On the other hand, the upper limit of the viscosity of the synthetic resin is 300,000 mPa·s because the pressure necessary to discharge the synthetic resin from the nozzle becomes a high pressure that is difficult to be obtained by a typical compressor (e.g., about 1.5 MPa) if the viscosity of the synthetic resin is too high. Further, such a synthetic resin with high viscosity is difficult to be homogeneously discharged, and the resulting width of the insulating film is also heterogeneous.

FIG. 6 shows properties of insulating film materials and properties of multilayered piezoelectric elements on which insulating films are formed by employing those materials. Sample No. 1 shown in FIG. 6 is a single-layer piezoelectric element (with no insulating films). Samples No. 2 to No. 12 are multilayered piezoelectric elements employing a light (ultraviolet) curable resin as insulating films, and formed by applying a liquid synthetic resin to the end portion of the electrode layer and then applying ultraviolet thereto for curing the resin. Sample No. 13 is a multilayered piezoelectric element employing a thermosetting resin that causes heat polymerization reaction by being heated and cures, and formed by applying a liquid synthetic resin to the end portion of the electrode layer and then keeping the sample at 60° C. for one hour to cure the resin. Sample No. 14 is a multilayered piezoelectric element employing glass as insulating films, and formed by depositing glass particles on the end portion of the electrode layer by using electrophoresis and then softening the glass particles by heating, and further, cooling for fixing the glass.

In any of Samples Nos. 2, 4-11 and 13 fabricated by employing the synthetic resins (viscosity: 500 mPa·s to 100,000 mPa·s), good electromechanical coupling factor $k_{33}$ are obtained ($k_{33}$=0.67 to 0.69). This is satisfactory values compared to the value ($k_{33}$=0.71) in Sample No. 1 of piezoelectric material alone. In Samples Nos. 4-11 and 13, the $t_W/t_H$ ratios are 14 or less within a range in which the samples can bear thinning of the piezoelectric material layers enough. Although the $t_W/t_H$ ratio in Sample No. 2 is slightly larger ($t_W/t_H$=28.5), the sample can be used in the case where the thickness of the piezoelectric material layer is about 100 μm.

In comparison, in Sample No. 3, although the resin material is used, the viscosity is too low (200 mPa·s). Accordingly, when the material is discharged from the dispenser, the material spreads to adjacent internal electrodes (the width is about 200 μm) before curing with light. Therefore, it is difficult to fabricate a multilayered piezoelectric element by employing a resin having too low viscosity.

Further, in Sample No. 12, since the material has too high viscosity (500,000 mPa·s), the resin cannot be discharged from the nozzle in a homogeneous width. Therefore, the resin with too high viscosity is inappropriate for forming insulating films of the multilayered piezoelectric element.

Furthermore, in Sample No. 14, although the $t_W/t_H$ ratio in a desirable range can be obtained, the electromechanical coupling factor $k_{33}$ decreases. This is because the Young's modulus of the glass material ($52.0 \times 10^9$ Pa or $52.0 \times 10^{10}$ dyn·cm$^{-2}$) is extremely larger than the Young's modulus of the resin material ($1.30 \times 10^9$ Pa to $1.85 \times 10^9$ Pa or $1.30 \times 10^{10}$ dyn·cm$^{-2}$ to $1.85 \times 10^{10}$ dyn·cm$^{-2}$). From that, it is confirmed that the function of the multilayered piezoelectric element decreases because the displacement of the piezoelectric materials is braked by the insulating films on the surface thereof.

Thus, in the method of manufacturing a multilayered piezoelectric element according to the embodiment, a multilayered piezoelectric element with a high performance can be fabricated by employing a synthetic resin having appropriate viscosity in a liquid state.

Here, in the method of manufacturing a multilayered piezoelectric element that has been explained, the light curable synthetic resin is used because, by applying the synthetic resin with the dispenser while applying light to the application surface of the synthetic resin or applying light immediately after applying the synthetic resin, the resin can be cured while the shapes as applied (e.g., semi-columnar shape) and the aspect ratio are almost maintained. In this regard, the light curable resin is advantageous because the time for curing the liquid is short, the facility for curing is simple (e.g., an ultraviolet source), and the trouble to move the sample is saved unlike the thermosetting resin.

On the other hand, as described above, a multilayered piezoelectric element with a high performance can also be fabricated even when the thermosetting synthetic resin is employed. However, in the case of employing the thermosetting resin, there is a tendency that the time for curing becomes longer (e.g., about one hour) compared to the case of employing the light curable resin. In order to avoid the significant deformation of the shape of the resin in the time, a resin having viscosity to some degree (e.g., 15,000 mPa·s) or more is desirably employed.

Further, in the case of employing the light curable synthetic resin, the heat polymerization reaction may be caused by heating the light curable synthetic resin to cure it, or application of light and heat may be simultaneously utilized. In the latter case, the curing speed can be promoted compared to the case of applying only light.

Furthermore, in either case of employing the light curable resin or thermosetting synthetic resin, the synthetic resin may be cured by drying. In this case, a resin with relatively high viscosity is desirably employed because longer time is required for curing the resin than in the case of applying light and heat.

A multilayered piezoelectric element has been manufactured by using the method of manufacturing the multilayered piezoelectric element according to the embodiment, and the performance thereof has been measured. In a working example, ultraviolet curable resin 5×767 and U-1455 manufactured by Chemitec are employed as urethane acrylate light curable resins, and Epotec OG115 and OG142 manufactured by Epoxy Technology in U.S. are employed as epoxy light curable resins. Further, Desktop Robot JR2000 series (JANOME JR2000mini+EFD2200XL) manufactured by JANOME SAWING MACHINE is used as the dispenser.

Further, as a comparative example, a multilayered piezoelectric element was fabricated by using a method of depositing glass particles by electrophoresis.

The properties of the multilayered piezoelectric elements in the working example and the comparative example are shown in FIG. 7.

As shown in FIG. 7, it is confirmed that the performance of the multilayered piezoelectric element is improved by a little less than 10% by changing the material of the insulating film on the side surface from the conventional glass material to the resin material.

In the embodiment that has been explained, the liquid synthetic resin is applied on the end portion of the internal electrode layer by using the dispenser. However, the synthetic resin may be placed on the end portion of the internal electrode layer by using other liquid feed mechanism. For example, the synthetic resin may be placed by using an inkjet system, screen printing, or the like. Alternatively, the synthetic resin may be placed by pressing down a stamp having a cartridge provided thereon to the end portion of the internal electrode layer. Alternatively, the synthetic resin may be placed by depositing the liquid synthetic resin on the tip of the needle and tracing the end portion of the internal electrode layer with the needle or dropping the synthetic resin from the needle.

In the embodiment, light is applied to the resin while the light curable resin is applied. However, after the application of the resin to one side surface of the multilayered structure is ended, the light curable resin may be cured at once by applying light to the side surface. Also in this case, the material can be cured earlier than in the case of employing other kinds of resins, and thus, the aspect ratio of the insulating film is easily maintained at a high value.

In the embodiment, explanation is made in the case where the multilayered piezoelectric element has a rectangular parallelepiped shape. However, other various element shapes may be used. For example, the shape of the multilayered piezoelectric element may be a polygonal prism shape such as a triangular prism, pentagonal prism and so on, or a cylindrical shape. Further, the regions on which the insulating films and the side electrodes are formed are not limited to opposite two side surfaces (see FIG. 1) as long as the contact between the two side electrodes can be avoided. For example, as shown in FIG. 8, insulating films 41 and 42 may be formed on adjacent two side surfaces of the multilayered structure 22, respectively, and two side electrodes 44 and 45 sandwiching an insulating region 43 may be formed on the surfaces thereof. Alternatively, as shown in FIG. 9, insulating films 51 and 52 may be formed on one side surface of the multilayered structure 22 in a staggered manner, and a side electrode 53 connected to the lower electrode 25 and a side electrode 54 connected to the upper electrode 26 may be formed side-by-side on the surfaces thereof. In FIG. 9, each of the insulating films 51 and 52 and side electrodes 53 and 54 is formed separately in plural regions. In this case, the multilayered structure 22 is cut in positions of broken lines, and thereby, plural multilayered piezoelectric elements can be simultaneously obtained.

As explained above, according to the embodiment, since the insulating films are formed of the synthetic resin, sufficient displacement can be obtained when the multilayered piezoelectric element is driven. Further, since the liquid synthetic resin is placed on the end portion of the electrode layer by using the liquid feed mechanism such as the dispenser, the process becomes simpler and the thinning of the piezoelectric material layers can be easily accommodated. Furthermore, in the embodiment, since the size and shape of the insulating films are specified in consideration of poling treatment, breakdown hardly occurs and the piezoelectric material layers can be sufficiently poled. Therefore, a small multilayered piezoelectric element with a high piezoelectric performance can be obtained and the performance of devices (ultrasonic transducer, piezoelectric actuator, or the like) to which the multilayered piezoelectric elements are applied can be improved.

The invention claimed is:

1. A method of manufacturing a multilayered piezoelectric element, said method comprising the steps of:
    (a) forming a multilayered structure including plural piezoelectric material layers, at least one first electrode layer, and at least one second electrode layer, said at least one first electrode layer and said at least one second electrode layer alternately stacked with respective one of said plural piezoelectric material layers in between;
    (b) coating a liquid synthetic resin on an end portion of said at least one first electrode layer in a first region within side surfaces of said multilayered structure by using a liquid feed mechanism, and curing the liquid synthetic resin to form at least one first insulating film;
    (c) coating a liquid synthetic resin on an end portion of said at least one second electrode layer in a second region different from the first region within the side surfaces of said multilayered structure by using the liquid feed mechanism, and curing the liquid synthetic resin to form at least one second insulating film;
    (d) forming a first side electrode in said first region such that said first side electrode is connected to the end portion of said at least one second electrode layer, and passed through a surface of said at least one first insulating film so as to be insulated from said at least one first electrode layer;
    (e) forming a second side electrode in said second region such that said second side electrode is connected to the end portion of said at least one first electrode layer, and passed through a surface of said at least one second insulating film so as to be insulated from said at least one second electrode layer; and
    (f) performing poling treatment on said plural piezoelectric material layers by applying a voltage equal to $n \cdot E_c \cdot H_N$ between said first side electrode and said second side electrode, where $n>1$, $H_N$ is a thickness of each of said plural piezoelectric material layers, $E_c$ is a coercive electric field thereof,
    wherein each of steps (b) and (c) includes forming respective one of said first and second insulating films such that each of a shortest distance from the end portion of said first electrode layer to a surface of said first insulating film and a shortest distance from the end portion of said second electrode layer to a surface of said second insulating film becomes larger than $n \cdot E_c \cdot H_N/E$, where E is an electrical withstand voltage of said first and second insulating films.

2. The method according to claim 1, wherein:
    said liquid synthetic resin includes a synthetic resin that cures at least when light is applied thereto;
    step (b) includes curing the liquid synthetic resin by applying light to the liquid synthetic resin placed on the end portion of said at least one first electrode layer; and
    step (c) includes curing the liquid synthetic resin by applying light to the liquid synthetic resin placed on the end portion of said at least one second electrode layer.

3. The method according to claim 1, wherein:
    said liquid synthetic resin includes a synthetic resin that cures at least when heat is applied thereto;
    step (b) includes curing the liquid synthetic resin by applying heat to the liquid synthetic resin placed on the end portion of said at least one first electrode layer; and
    step (c) includes curing the liquid synthetic resin by applying heat to the liquid synthetic resin placed on the end portion of said at least one second electrode layer.

4. The method according to claim 1, wherein said liquid synthetic resin includes one of an epoxy synthetic resin, an urethane acrylate synthetic resin, a silicone synthetic resin, and an oxetane synthetic resin.

5. The method according to claim 1, wherein each of steps (b) and (c) includes using a synthetic resin having viscosity in a range from 500 mPa·s to 300,000 mPa·s.

6. The method according to claim 5, wherein each of steps (b) and (c) includes using a synthetic resin having viscosity in a range from 4,000 mPa·s to 50,000 mPa·s.

7. The method according to claim 1, wherein each of steps (b) and (c) includes forming respective one of said first and second insulating films such that a ratio of width/thickness of said first and second insulating films becomes less than $2E/E_c$.

* * * * *